United States Patent [19]
Fandrich et al.

[11] Patent Number: 5,355,464
[45] Date of Patent: Oct. 11, 1994

[54] CIRCUITRY AND METHOD FOR SUSPENDING THE AUTOMATED ERASURE OF A NON-VOLATILE SEMICONDUCTOR MEMORY

[75] Inventors: Mickey L. Fandrich, Placerville; Virgil N. Kynett, El Dorado Hills, both of Calif.

[73] Assignee: Intel Corporation, Santa Clara, Calif.

[21] Appl. No.: 655,650

[22] Filed: Feb. 11, 1991

[51] Int. Cl.⁵ .................. G06F 13/00; G06F 9/312; G11C 16/06
[52] U.S. Cl. .................. 395/425; 365/218; 364/DIG. 1; 395/375
[58] Field of Search .............. 395/425, 375; 365/218

[56] References Cited

U.S. PATENT DOCUMENTS

| | | | |
|---|---|---|---|
| 4,327,410 | 4/1982 | Patel et al. | 395/425 |
| 4,974,208 | 11/1990 | Nakamura et al. | 365/228 |
| 5,034,922 | 7/1991 | Burgess | 365/218 |
| 5,036,488 | 7/1991 | Motarjemi | 365/218 |
| 5,053,990 | 10/1991 | Kreifels et al. | 395/425 |
| 5,222,046 | 6/1993 | Kreifels | 365/230 |

Primary Examiner—Glenn Gossage
Attorney, Agent, or Firm—Blakeyl, Sokoloff, Taylor & Zafman

[57] ABSTRACT

Circuitry for suspending an automated sequence for a nonvolatile semiconductor memory is described. The circuitry and memory reside on the same substrate. The circuitry includes a circuit for suspending erasure at a predetermined state of the erase sequence when a suspend signal is active and a circuit for resuming erasure at a predetermined state of the erase sequence when the suspend signal goes inactive. A method for suspending automated erasure sequence of a non-volatile semiconductor memory is also described. A suspend signal is received and erasure is suspended after a first erasure step of the erase sequence if suspend signal is active. Erasure resumes at a second erasure step of the erase sequence when the suspend signal goes inactive.

18 Claims, 9 Drawing Sheets

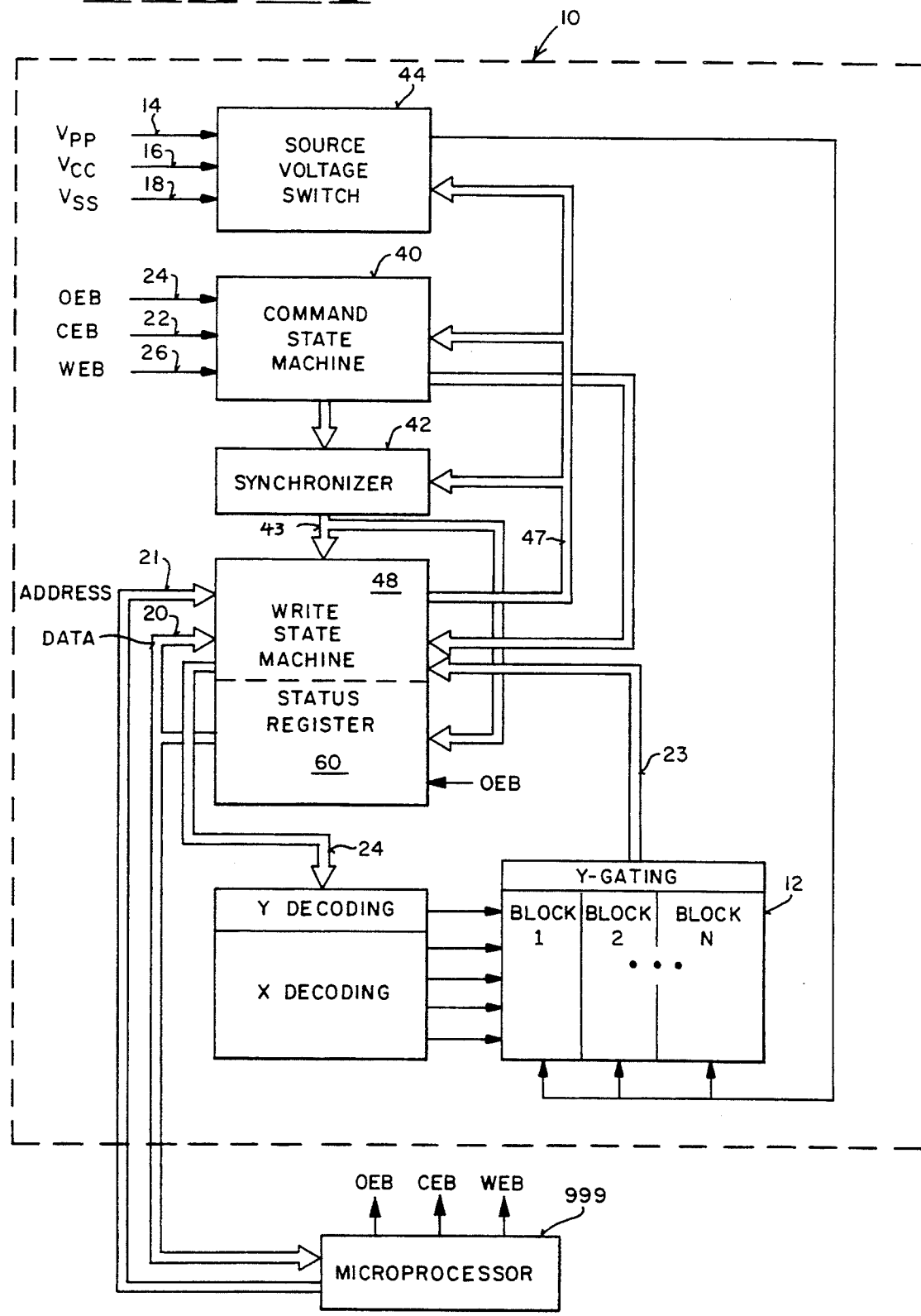

FIG_2

| COMMAND | BUS CYCLES REQ'D | FIRST BUS CYCLE | | | SECOND BUS CYCLE | | |
|---|---|---|---|---|---|---|---|
| | | OPERATION | ADDRESS | DATA | OPERATION | ADDRESS | DATA |
| READ ARRAY | 1 | WRITE | X | FFH | | | |
| READ STATUS REGISTER | 2 | WRITE | X | 70H | READ | X | SRD |
| CLEAR STATUS REGISTER | 1 | WRITE | X | 50H | | | |
| ERASE SETUP/ERASE CONFIRM | 2 | WRITE | BA | 20H | WRITE | BA | D0H |
| ERASE SUSPEND/ERASE RESUME | 2 | WRITE | BA | B0H | WRITE | BA | D0H |

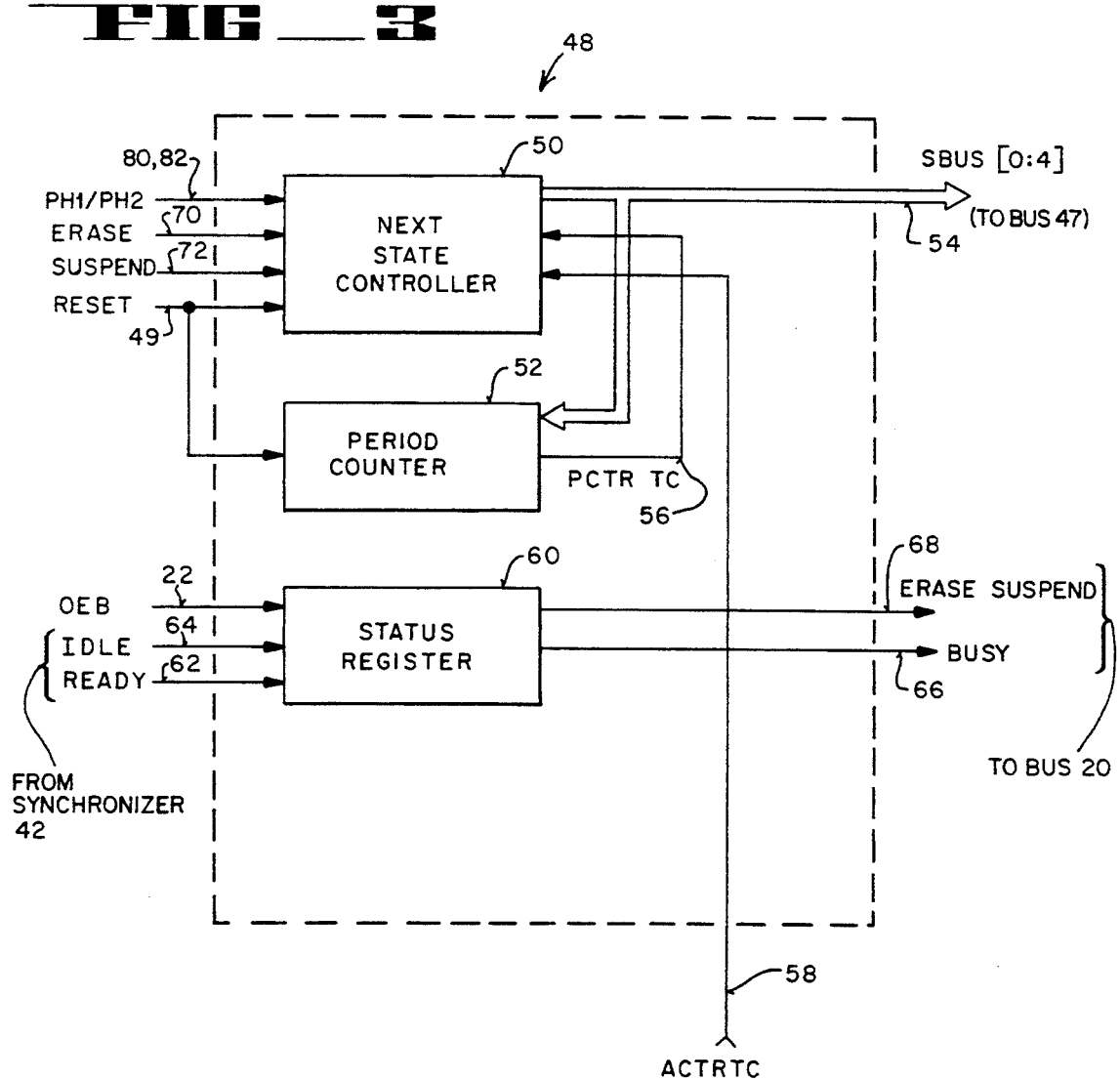

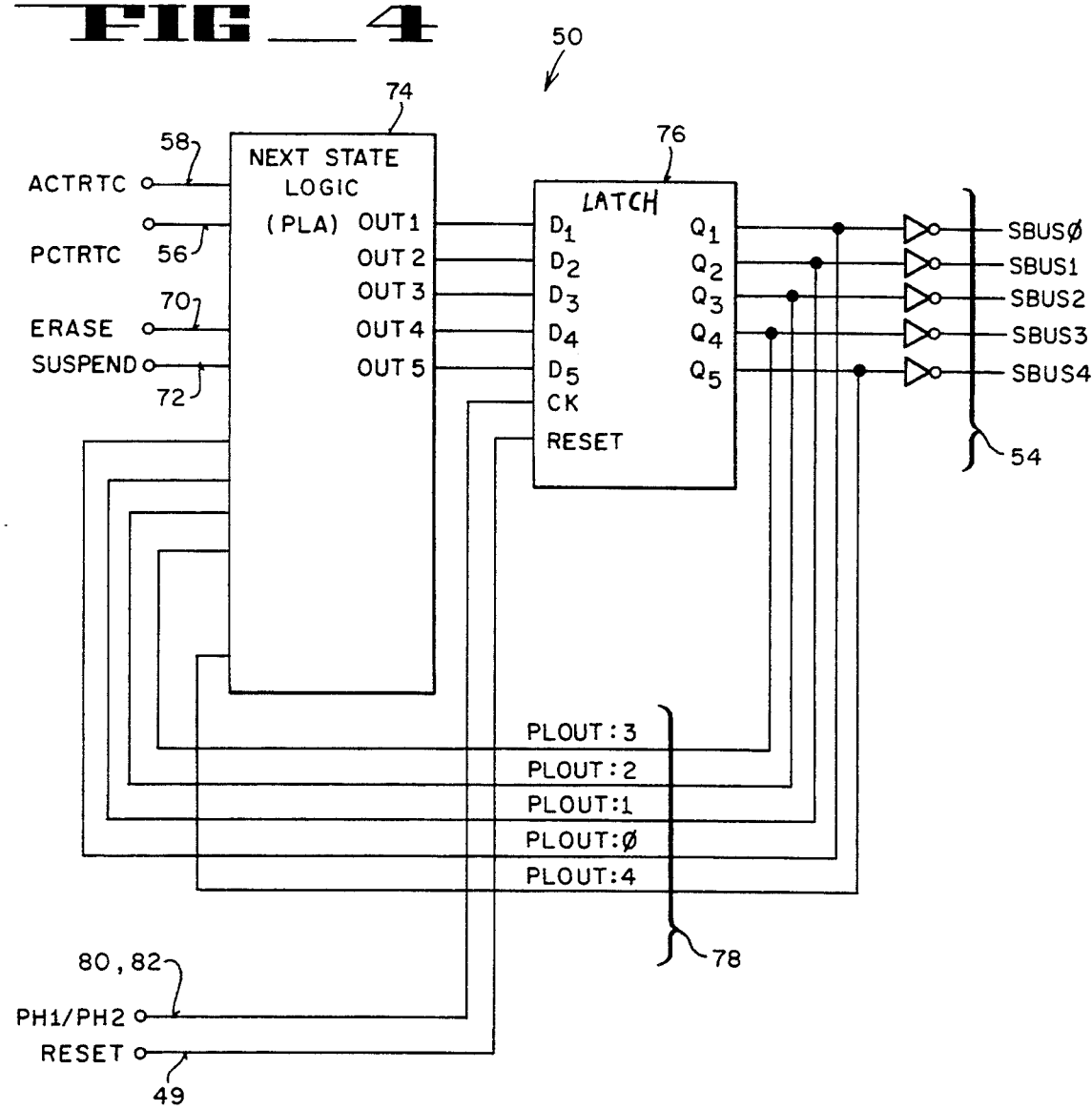

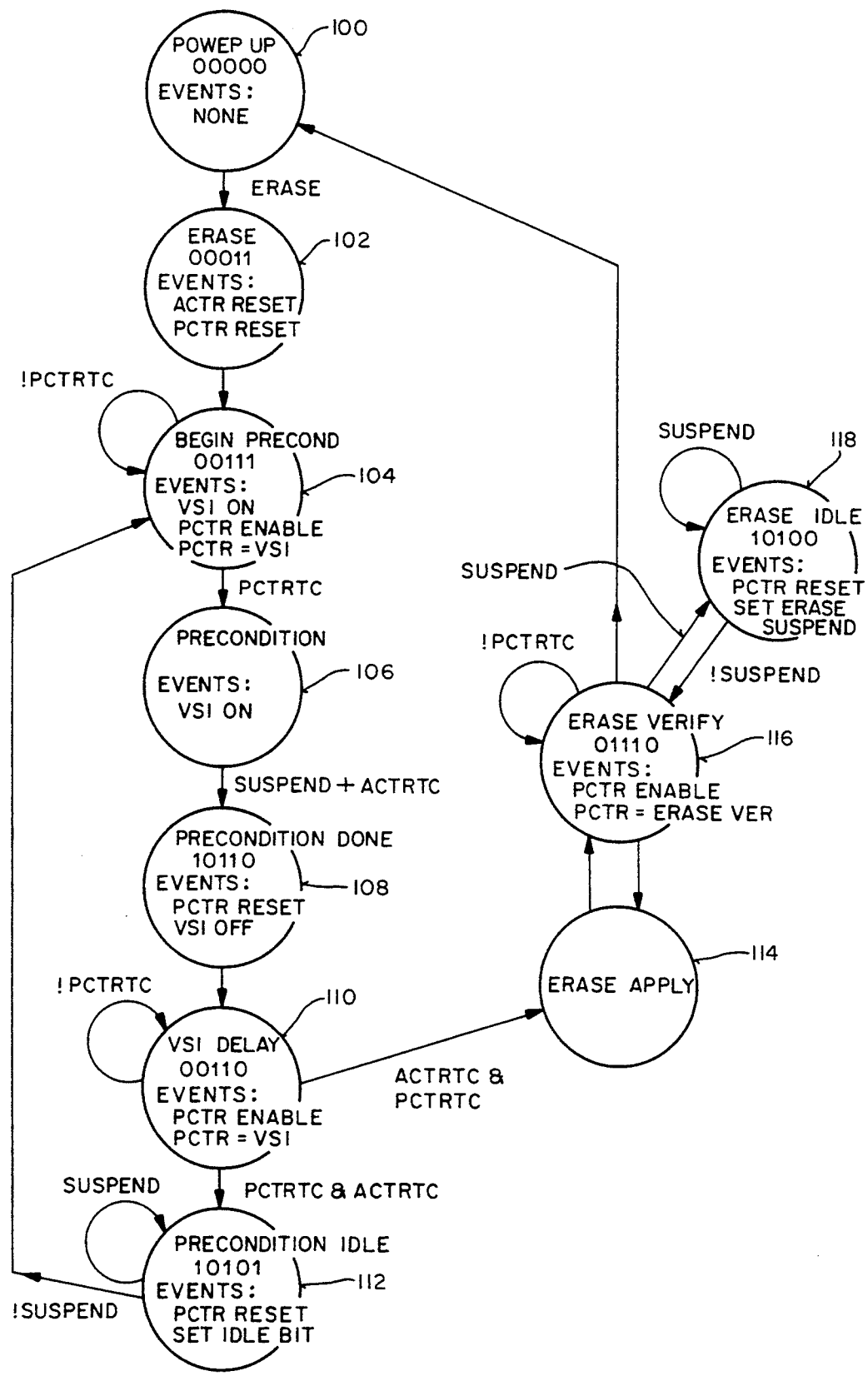

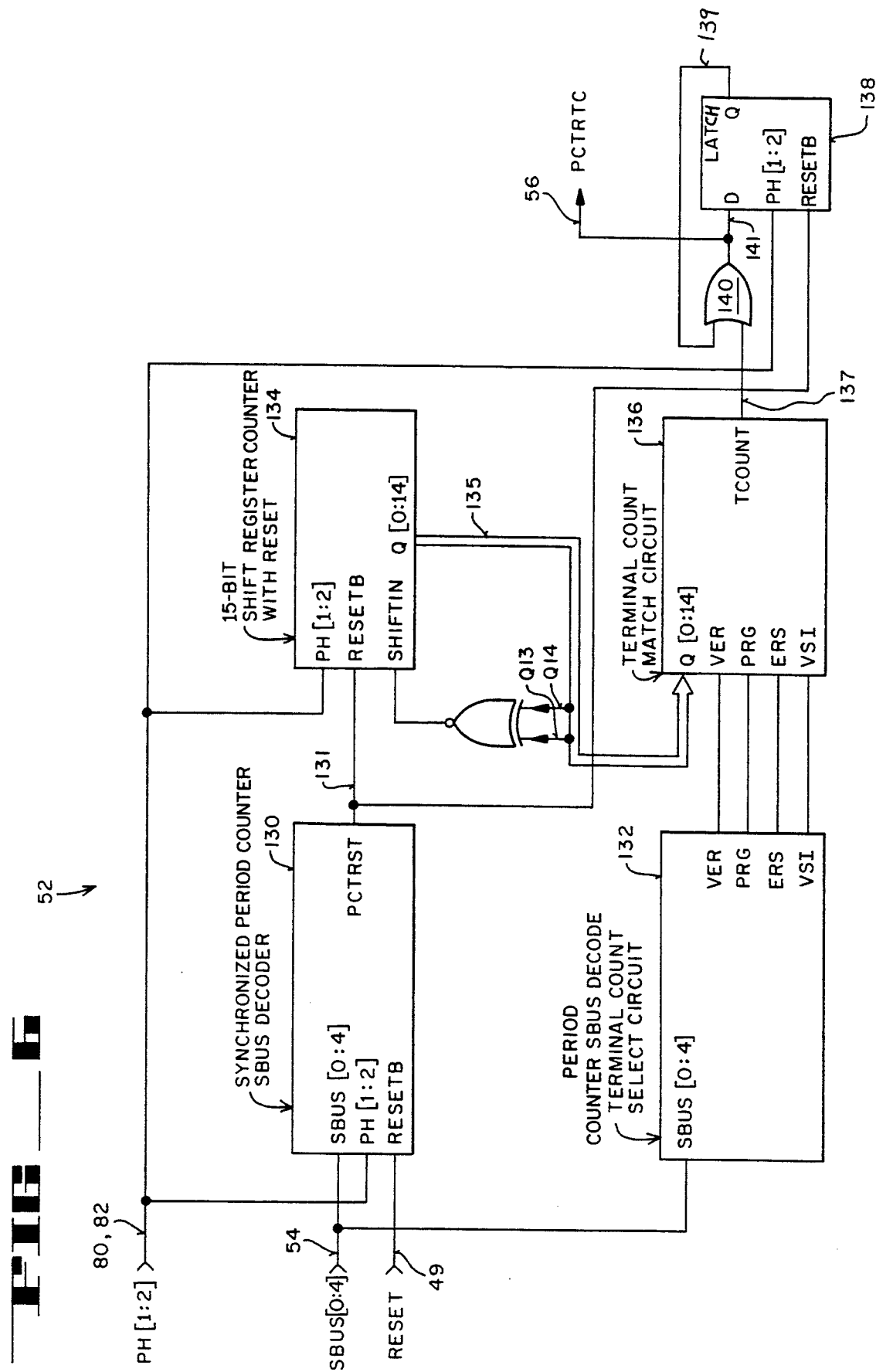

FIG__7

| SBUS VALUE | SIGNAL ACRONYMS AND VALUE | STATE NAME |
|---|---|---|
| 00000 | 0 0 0 0 0 0 0 0 0 0 0 0 0 0 0 0 0 0 | POWER UP |
| 00011 | 0 1 0 0 0 0 0 0 0 0 0 0 0 0 0 0 0 0 | ERASE |
| 00110 | 0 0 0 0 0 1 0 0 0 0 0 0 0 0 0 0 0 0 | VSI DELAY |
| 00111 | 0 0 0 1 0 0 0 0 0 1 0 0 0 0 0 0 0 0 | BEGIN PRECOND |
| 01110 | 0 0 1 0 0 0 0 0 0 0 0 0 0 0 0 0 0 0 | ERASE VERIFY |
| 10100 | 1 0 0 0 0 0 1 0 0 0 0 0 1 0 0 1 0 0 | ERASE IDLE |
| 10101 | 1 0 0 0 0 0 1 0 0 0 0 0 1 0 0 0 0 – | PRECOND IDLE |
| 10110 | 1 0 0 0 0 0 0 0 0 0 0 0 0 0 0 0 0 0 | PRECOND DONE |

FIG. 11

| SIGNAL ACRONYM | SIGNAL NAME |
|---|---|
| PCTRST | – PERIOD COUNTER RESET (PCTR RUNS IN ALL STATES RESET IS NOT ASSERTED) |
| PCTSELERS | – PERIOD COUNTER TC OUT = ERASE PULSE WIDTH |
| PCTSELPGM | – PERIOD COUNTER TC OUT = PROGRAM PULSE WIDTH |
| PCTSELVER | – PERIOD COUNTER OUT = PROGRAM VERIFY DELAY |
| PCTSELVSI | – PERIOD COUNTER TC OUT = VSI ON/OFF DELAY |
| DE | – DATA PATH ENABLE (SENSE AMPS/DRAIN BIAS, ETC.) |
| READY | – SET RDY/BSYB = 1 |
| IDLE | – SET ERASE SUSPENDED BIT |
| ACTRST | – ADDRESS COUNTER RESET |
| ACTREN | – ADDRESS COUNTER ENABLED FOR COUNTING |
| VSION | – TURN VSI CIRCUITRY ON, APPLY TO NON-SELECTED BLOCKS |
| PGSETUP | – PROGRAM SETUP |
| PGM | – PROGRAM DATA IN TO SELECTED BLOCK |
| ERASE | – APPLY ERASE VOLTAGES TO SELECTED BLOCK |
| ERVER | – TURN ERASE VERIFY CIRCUITRY ON |
| PGVER | – TURN PROGRAM VERIFY CIRCUITRY ON |
| AE | – ENABLE THE ARRAY (X DECODERS, ETC.) |

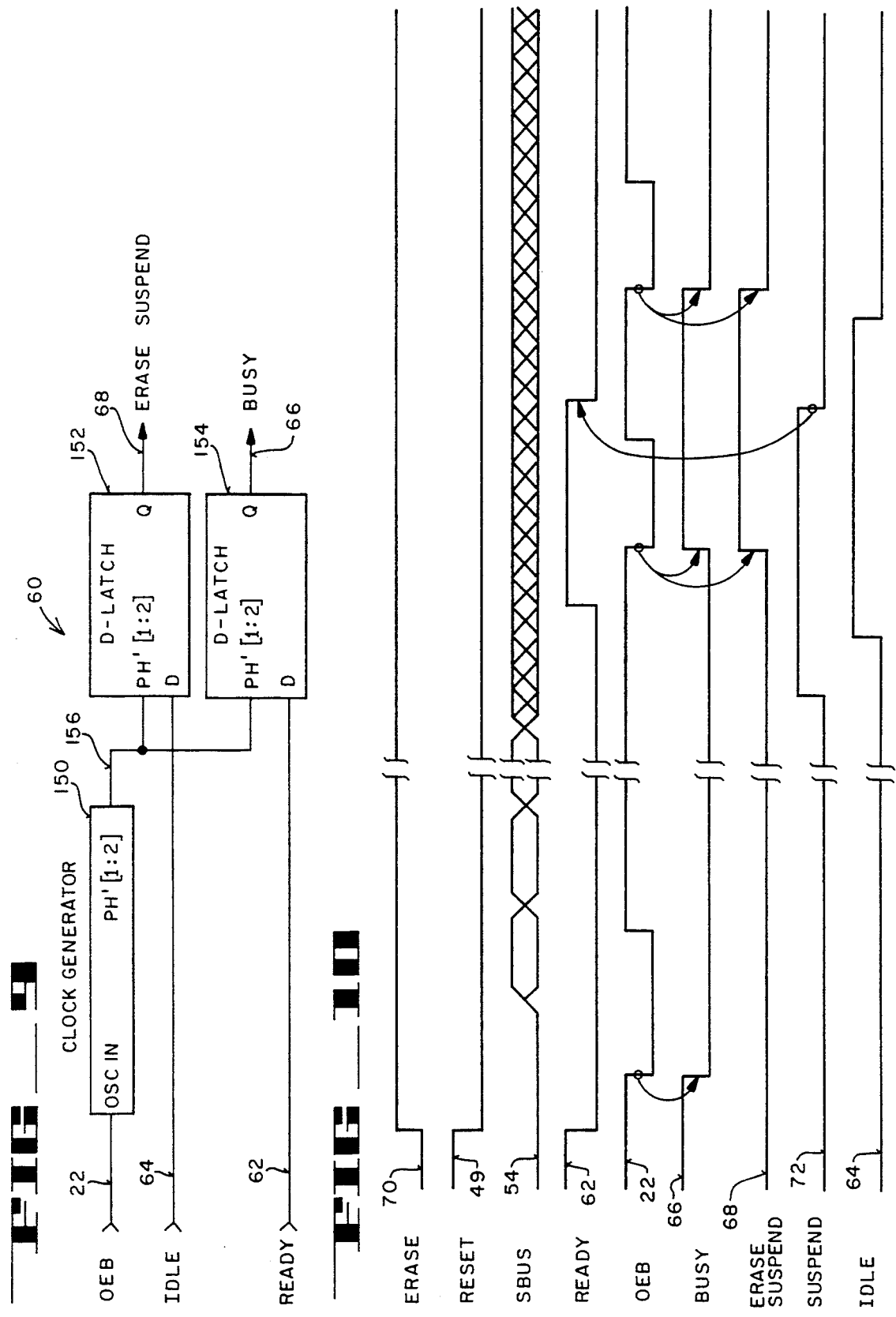

CIRCUITRY AND METHOD FOR SUSPENDING THE AUTOMATED ERASURE OF A NON-VOLATILE SEMICONDUCTOR MEMORY

FIELD OF THE INVENTION

The present invention relates to the field of non-volatile semiconductor memories. More particularly, the present invention relates to a circuit and method for suspending an automated erase sequence of a non-volatile semiconductor memory.

BACKGROUND OF THE INVENTION

One type of prior non-volatile semiconductor memory is the flash electrically erasable programmable read-only memory ("flash EEPROM"). The flash EEPROM can be programmed by a user, and once programmed, the flash EEPROM retains its data until erased. After erasure, the flash EEPROM may be programmed with new code or data.

Flash memories differ from conventional electrically erasable programmable read only memory ("EEPROMs") with respect to erasure. Conventional EEPROMs typically use a select transistor for individual byte erase control. Flash memories, on the other hand, typically achieve much higher density with single transistor cells. During one prior art erase mode for a flash memory, a high voltage is supplied to the source of every memory cell in a memory array simultaneously. This results in a full array erasure.

For one prior flash EEPROM, a logical "one" means that few if any electrons are stored on a floating gate associated with a bit cell. A logical "zero" means that many electrons are stored on the floating gate associated with the bit cell. Erasure of that prior flash memory causes a logical one to be stored in each bit cell. Each single bit cell of that flash memory cannot be overwritten from a logical zero to a logical one without a prior erasure. Each single bit cell of that flash memory can, however, be overwritten from a logical one to a logical zero, given that this entails simply adding electrons to a floating gate that contains the intrinsic number of electrons associated with the erased state.

One prior flash EEPROM is the 28F256 complementary metal oxide semiconductor ("MOS") flash memory sold by Intel Corporation of Santa Clara, Calif., which is a 256 kilobit flash EEPROM. The 28F256 flash memory includes a command register to manage electrical erasure and reprogramming. Commands are written to the command register from a controlling microprocessor using standard microprocessor write timings. The command register contents serve as input to an internal state machine that controls erase and programming circuitry.

The controlling microprocessor controls the erasure and programming of the flash memory. A prior Quick-Erase TM algorithm of Intel Corporation can be used by the microprocessor to erase the flash memory. The prior Quick-Erase TM algorithm requires that all bits first be programmed to their charged state, which is data equal to 00 (hexadecimal). Erasure then proceeds by pulling transistor sources within the array to the Vpp level for a period of 10 milliseconds. After each erase operation, byte verification is performed. The prior Quick-Erase TM algorithm allows up to 3000 erase operations per erasure sequence prior to recognizing erasure failure. Proper device operation requires that the erasure procedure be strictly followed.

One disadvantage of the Intel Quick-Erase TM algorithm is that erasure can take as long as 1 second, and during that time the contents of the flash memory cannot be accessed.

The prior Quick-Pulse Programming TM algorithm of Intel Corporation can be used by the microprocessor to program the flash memory after erasure. The Quick-Pulse Programming TM algorithm requires that a programming pulse of a specific duration and voltage level be applied to the selected transistors in the array. For example, for certain prior Intel flash memories a programming pulse of 10 microseconds is suggested while Vpp is held at 12.75 volts. After the programming pulse is applied to the selected memory cells, the user must verify whether the memory cell addressed is properly programmed. If not properly programmed, a programming pulse may be reapplied a number of times before a programming error is recognized. Intel's Quick-Pulse Programming TM algorithm allows up to 25 programming operations per byte. Proper and reliable operation of the flash memory mandates that the programming procedure be strictly followed.

One disadvantage of the prior way of using a controlling microprocessor to control the erasure and programming of the flash memory is that it ties up the microprocessor and requires a relatively high level of microprocessor overhead. This, in turn, decreases computer system throughput.

Another disadvantage of the prior way of using a microprocessor to control the erasure and programming of the flash memory is the relatively high complexity of typical erasure/programming software. This complexity increases the likelihood of a customer error, such as overerasure of the flash memory.

SUMMARY AND OBJECTS OF THE INVENTION

One of the objects of the present invention is to provide circuitry and a method for temporarily suspending the automated erasure of a non-volatile semiconductor memory in order to allow an external processor to read data stored within the memory during erasure.

Circuitry for suspending the automated erasure of a non-volatile semiconductor memory is described. The circuitry and non-volatile semiconductor memory reside together on a single substrate. The circuitry includes means for suspending erasure when and suspend signal is active and means for resuming erasure when the suspend signal is inactive.

A method for suspending the automated erasure of a non-volatile semiconductor memory is also described. Erasure is suspended when a suspend signal is at a first logic level. Automated erasure resumes when the suspend signal is at a second logic level.

Other objects, features, and advantages will be apparent from the accompanying drawings and from the detailed description that follows below.

BRIEF DESCRIPTION OF DRAWINGS

The present invention is illustrated by way of example and not limitation in the figures of the accompanying drawings in which like references indicate similar elements and in which:

FIG. 1 is a block diagram of circuitry of a flash memory;

FIG. 2 is a table of device commands;

FIG. 3 is a block diagram of a portion of a write state machine and status register;

FIG. 4 is a block diagram of a next state controller;

FIG. 5 is a state diagram of a method of suspending an automated erase sequence;

FIG. 6 is a block diagram of a period counter;

FIG. 7 is a table of SBUS states;

FIG. 8 is a table of signal names;

FIG. 9 is a block diagram of the status register;

FIG. 10 is a timing diagram of inputs to and outputs from the write state machine and the status register.

DETAILED DESCRIPTION

FIG. 1 illustrates in block diagram form the circuitry of flash EEPROM 10, which implements a preferred embodiment of the present invention. Flash EEPROM 10 is also referred to as flash memory 10. Flash memory 10 includes a blocked memory array 12, which includes memory cells that store data at address locations. Each block can be separately read, programmed and erased.

In addition to blocked memory array 12, flash memory 10 includes on-chip command state machine ("CSM") 40, synchronizer 42, source voltage switch 44, status register 60, and write state machine ("WSM") 48. The WSM 48 controls block erase operations, which frees system processor 999 for other tasks.

In a preferred embodiment, the circuitry of flash memory 10 shown in FIG. 1 is on a single substrate. In a preferred embodiment, flash memory 10 employs CMOS circuitry.

As described in more detail below, write state machine 48 incorporates circuitry for suspending the automated erasure of a selected block of memory within memory 12. Erasure halts at a predetermined state of the erase sequence, allowing microprocessor 999 to read data from a block other than the one that is being erased. At the microprocessor's request, erasure resumes at a predetermined state of the erase sequence.

Vpp 14 is the erase/program power supply voltage for the flash memory 10. Vcc 16 is the device power supply for flash memory 10 and Vss 18 is ground. In one embodiment, Vpp 14 is 12.0 volts and Vcc 16 is approximately 5 volts.

In the absence of high voltage on Vpp 14, flash memory 10 acts as a read-only memory. The data stored at the addressed location is read from memory array 12 and made available via data lines 20 to the circuitry external to the flash memory 10.

Flash memory 10 has three control input signals: chip-enable CEB 22, write-enable bar WEB 26, and output-enable OEB 24. The suffix "B" in each of these control signal names denotes that they are active low signals. Chip-enable CEB input 22 is used to select flash memory 10. CEB 22 is active low. The output-enable input OEB 24 is the output control for flash memory 10 and should be used to gate data from the data pins 20 of flash memory 10. OEB 24 is active low. Both control functions CEB 22 and OEB 24 must be logically active to obtain data at the data lines 20 of flash memory 10.

The microprocessor 999 controlling flash memory 10 writes to memory 10 by bringing WEB 26 to a logic low level while CEB 22 is low. Addresses and data are latched on the rising edge of WEB 26. Standard microprocessor timings are used.

Device operations, which are also called commands, are selected by writing specific data patterns via the data lines 20. FIG. 2 defines certain device commands. SRD in FIG. 2 represents data read from the status register. BA in FIG. 2 represents an address within the block being erased.

Erase is executed one block at a time, initiated by a two-cycle command sequence. An Erase Setup command is first written to command state machine 40 shown in FIG. 1, followed by the Erase Confirm command. These commands require both appropriate command data and addresses within the block to be erased. Microprocessor 999 can detect the completion of the erase event by issuing a Read Status Register command and analyzing the status data output on data pins 20.

Erasure typically takes 1 second per block. This relatively long period of time and the blocked architecture of flash memory 10 makes the Erase Suspend command desirable, as microprocessor 999 may wish to retrieve data that is held in one block while another block is being erased.

The Erase Suspend command allows erase sequence interruption in order to read data from a block on the same chip other than the block currently being erased. After the erase sequence is started, writing the Erase Suspend command (B0H) to the data lines 20 cause write state machine 48 to suspend the erase sequence at one of a number of predetermined states of the erase sequence. Polling the status register's BUSY bit 66 and ERASE SUSPEND bit 68 allows microprocessor 999 to determine when the erase operation has been suspended.

After erasure has been suspended, a Read Array command can be written to the data lines 20 to read data from blocks in the same silicon substrate other than the block that is in the process of being erased.

Another valid command after erasure has been suspended is Erase Resume ("D0H"), which causes WSM 48 to continue with the erase sequence at a predetermined state. Resuming erasure causes the ERASE SUSPEND bit of the status register 60 to be cleared and the BUSY bit 66 to be set again.

Flash memory 10 of FIG. 1 operates as follows. The data on the data lines 20 is passed on to the command state machine 40 via bus 47. The CSM 40 decodes the data via bus 47 and if it represents a command, begins generating the appropriate control signals for the write state machine 48.

The synchronizer 42 provides synchronization and handshaking between the write state machine 48 and the command state machine 40. The synchronizer 42 also reports the status of WSM 48 to status register 60.

The program and erase algorithms for memory array 12 are regulated by write state machine 48. The write state machine 48 latches in the necessary addresses and data needed to complete erase, suspend, resume, and read operations from inputs 20 and 21. Write state machine 48 interfaces with memory array 12 via lines 23 and lines 24.

The write state machine 48 reports its progress during function execution to synchronizer 42 and status register 60.

The status register 60 reports the status of the write state machine 48 via the status register outputs, which are provided to microprocessor 999 on DATA pins 20.

FIG. 3 illustrates in block diagram form a portion of the circuitry of write state machine 48 and status register 60. The write state machine 48 includes a next state controller 50 and a period counter 52.

The next state controller 50 controls and coordinates the activities of all of the write state machine 48 circuitry, portions of which are not shown. The next state controller 50 also controls the function of the source voltage switch 44 and the memory array 12, thereby controlling the erasure and reading of the array 12. The procedure by which the next state controller 50 achieves its function will be discussed in more detail below.

The RESET signal 49 is generated by the synchronizer 42 and is applied to nearly all circuits within write state machine 48. RESET 49 releases certain nodes within the write state machine 48 from known states. For example, RESET 49 holds at a logic low the terminal count signal 56 of the period counter 52 and the terminal count signal of the address counter (not shown). RESET 49 also holds the next state controller 50 in the Power Up state.

Next state controller 50 generates five output signals SBUS[0:4] 54 to indicate its current state. SBUS[0:4] 54 is decoded by circuitry within the WSM 48, and by the synchronizer 42 and the source voltage switch 44 to determine the requested action.

Next state controller 50 determines the next value of SBUS[0:4] 54 based upon the previous SBUS[0:4] 54 value and upon whether the period counter 52 and address counter have reached their terminal counts, as indicated by PCTRTC 56 and ACTRTC 58. Other factors affecting the next state controller's 50 determination of the next values of SBUS[0:4] 54 include whether an erase command has been received, as indicated by an active ERASE signal 70, and whether the microprocessor 999 has requested the erase be suspended, as indicated by an active SUSPEND signal 72.

The period counter 52 determines the length of various time periods during erase operations. Theses time periods include, the proper period of time the erase voltage should be applied to the array 12. The period counter 52 also indicates the proper period of time required for the high voltage circuits to apply and remove a source inhibit voltage, VSI, to blocks of memory array 12 that are not selected for erasure. Let us call blocks that are not selected for erasure "nonselected blocks" and the block which has been selected for erasure the "selected block." The application of VSI to the sources of nonselected blocks prevents them from being slowly programmed during the preconditioning of the selected block. The period counter provides sufficient delay between the application of VSI and the beginning of preconditioning to prevent the undesired programming of nonselected blocks. The signal PCTRTC 56 informs the next state controller 50 that the proper period of time has elapsed when PCTRTC 56 is a logic high.

The address counter indicates to next state controller 50 that the end of the selected block of memory 12 has been reached by forcing its terminal count ACTRTC 58 to a logic high.

The status register 60 serves as the window for microprocessor 999 into the operation of the write state machine 48. The status register 60 receives various status signals and synchronizes them to output enable signal OEB 22.

The status register 60 receives as an input the READY signal 62 from the synchronizer 42 with bus 43. READY 62 indicates to CSM 40 and the status register 60 that the write state machine 48 is ready to perform another operation when it is a logic high. When READY 62 is a logic low, write state machine 48 is busy performing an erase or program operation.

When it is logic low, the status register's output signal WSM BUSY 66 indicates to microprocessor 999 that write state machine 48 is performing an erase operation. BUSY signal 66 indicates that write state machine 48 is available to perform another operation by going to a logic high.

The status register 60 receives IDLE signal 64 from the synchronizer 42 via bus 43. When it is a logic high IDLE 64 signal indicates to the status register that write state machine 48 has suspended its erase operation. The IDLE signal 64 returns to a logic low after the write state machine 48 has resumed erasing the selected block.

The status register's output signal ERASE SUSPEND 68 indicates to microprocessor 999 that the write state machine 48 has suspended its erase operation by going to a logic high. The microprocessor 999 can read nonselected memory blocks after both ERASE SUSPEND 68 and BUSY 66 go to a logic high. The ERASE SUSPEND signal 68 indicates that the WSM 48 has resumed erasure by returning to its inactive level.

FIG. 4 illustrates in block diagram form the circuitry of next state controller 50, which includes next state logic 74 and a master slave D-latch 76. In the preferred embodiment, the next state logic 74 is a programmable logic array ("PLA").

The next state logic 74 determines the next state of each circuit within the write state machine 48 based upon the write state machine's previous state, as represented by PLOUT[0:4] 78, the terminal count signals PCTRTC 56 and ACTRTC 58, SUSPEND 72, and ERASE 70.

The outputs from next state logic 74 are latched into latch 76, which synchronizes them to PH1/PH2. These synchronized signals are provided to the rest of the write state machine 48 circuitry as SBUS[0:4] 54.

The latch 76 is reset by RESET 49 at the beginning of each program and erase operation. This forces SBUS[0:4] 54 to a known value, which represents the Power Up state 100.

The procedure implemented by the next state controller 50 for suspending and resuming erase operations can be understood with reference to the state diagram of FIG. 5.

In FIG. 5, each block represents a state or several states of the write state machine 48. The name of each state is indicated on the top line of each block. Some of the signals that are selected or enabled during each state are listed below the SBUS[0:4] values. The combination of input signals that cause the next state controller 50 to branch to another state are generally indicated in text beside each branch, with inactive signals represented by an exclamation point "!" as a prefix to the signal name or acronym. For example, the inactive SUSPEND signal would be indicated by "!SUSPEND" according to this notational convention. It will be understood that next state controller 50 branches from one state to another state regardless of the inputs to next controller 50 when no signal or state combination of signals is indicated next to a branch.

From FIG. 5 it can be seen that erasing a block of memory array 12 involves two major tasks: preconditioning and erasing. Preconditioning programs cell threshold voltage to approximately 6.75 volts, which represents a logic O. Preconditioning protects the longevity of the flash memory 10 by preventing cell voltages during erasure from dropping to levels that could result in cell leakage.

When power is first applied to flash memory 10, the next state controller 50 is held in the POWER UP state 100 by RESET 49. No events occur in state 100, the next state controller 50 simply begins execution after an active PROGRAM or ERASE 70 signal is received from the command state machine 40. Receipt of an active ERASE 70 signal causes next state controller 50 to branch to the ERASE state 102.

In the ERASE state 102 the next state controller 50 initializes the write state machine 48 for array preconditioning by resetting the address counter and period counter 52.

The next state controller 50 branches to the BEGIN PRECOND state 104 from state 102. In state 104 the next state controller 50 applies a source inhibit voltage, VSI, to nonselected blocks of memory 12 by setting the source voltage switch 44 to the source inhibit voltage, VSI. This prevents nonselected blocks of memory 12 from being slowly programmed during the preconditioning of the selected block. The application of VSI to nonselected blocks also prevents block contents from being read. Block contents also cannot be read while the WSM 48 has control of the read path.

The next state controller 50 enables the period counter 52 and selects the period counter's VSI delay to ensure that preconditioning does not begin until the source lines of nonselected blocks reach VSI. The next state controller 50 remains in state 104 until the period counter 52 times out. When PCTRTC 56 becomes active logic high, the nonselected blocks have reached VSI and the next state controller branches into the Precondition state 106.

During the Precondition state 106, the next state controller 50 steps through a number of states to program each byte within the selected block to a logic zero. This is done a byte at a time. Throughout the Precondition state 106 the source inhibit voltage, VSI, is applied to nonselected blocks of flash memory 12.

During states 100, 102, 104 or 106, receipt of an active SUSPEND signal 72 before the period counter times out does not immediately effect the erase operation. The next state controller 50 branches from states 106 only when the preconditioning of the currently addressed byte is completed. Then in response to an active suspend signal, the next state controller 50 branches to states 108 from state 106.

In the state 108, the period counter 52 is reset. The source inhibit voltage VSI turned off, removing VSI from the nonselected block source lines. This allows the reading of nonselected blocks after the source lines fall to zero volts.

From state 108, the next state controller 50 branches to the VSI DELAY state 110. State 110 provides the delay necessary for the nonselected blocks source lines to transition from VSI to 0 volts. The next state controller 50 remains in state 110 until it receives an active PCTRTC signal 56.

If the address counter has not yet reached its maximum count, the active SUSPEND signal 72 causes the next state controller 50 to branch from state 110 to the Precondition Idle state 112.

In the Precondition Idle state 112, the next state controller 50 sits generally idle waiting for the SUSPEND signal 72 to go inactive. During state 112, the period counter 52 is reset in anticipation of resuming byte preconditioning after exiting state 112.

The next state controller 50 signals the rest of flash memory 10 that it is idled via the SBUS[0:4] 54. Circuitry decoding SBUS[0:4] 52 will signal microprocessor 999 through the status register that the microprocessor 999 may now read nonselected blocks of memory array 12.

When SUSPEND 72 goes inactive, the write state machine 48 resumes erasing the selected block at a predetermined state by branching to the Begin Precondition state 104 from state 112.

The next state controller 50 cycles through states 104, 106, 108, 110 and 112 as described herein above until the address counter reaches its terminal count.

When ACTRTC 58 becomes active the selected block has been successfully preconditioned. The next state controller 50 then begins the process of erasing the selected block by branching into the Erase Apply state 114 from state 110.

During the Erase Apply state 114, the next state controller 50 steps through the states necessary to erase a byte in the selected block. After an erase voltage has been applied to a byte, the next state controller 50 branches to state 116 from state 114.

In the Erase Verify state 116, the erasure of the indicated byte is verified. Events during the Erase Verify state 116 include the enabling the period counter 52 and selecting its erase verify count. The next state controller 50 remains in state 118 until the period counter 52 times out.

If the SUSPEND signal 72 is inactive, the next state controller 50 branches from state 116 to the Erase Apply state 114 to continue block erasure as necessary.

On the other hand, if an active SUSPEND signal 72 has been received during states 114 or 116, the next state controller 50 branches to the Erase Idle state 118 from state 116. Thus, it will be understood that while the WSM 48 may receive a suspend request during state 114, the WSM 48 will only enter the idle state 118 from state 116.

During the Erase Idle state 118, the next state controller 50 sits generally idle waiting for the SUSPEND signal 72 to become inactive. During state 118, the period counter 52 is reset in anticipation of verifying another byte of memory array 12. The next state controller 50 informs the rest of flash memory 10 that the write state machine 48 is idled via SBUS[0:4] 54. Circuitry decoding SBUS[0:4] 54 will signal the microprocessor 999 that it now may read nonselected blocks within memory array 12.

When the SUSPEND signal 72 becomes inactive, the next state controller 50 resumes execution of the automated erase sequence by branching back to the Erase Verify state 116 from state 118.

The next state controller 50 cycles through states 114, 116 and 118 as necessary until the entire selected block is erased. When the WSM 48 completes the erase operation, the next state controller 50 branches back to the Power Up state 100.

FIG. 6 illustrates in block diagram form the period counter 52. The period counter 52 includes a period counter SBUS decoder 130, a period counter terminal count select circuit 132, a 15 bit shift register counter 134, a terminal count match circuit 136, and a latch 138.

The synchronized period counter SBUS decoder 130 resets the counter 134. SBUS decoder 130 decodes SBUS[0:4] 54 and determines whether the counter should be reset. When the counter 134 is to be reset, decoder 130 brings its reset output PCTRST 131 to a logic low. SBUS decoder 130 makes these decisions on each PH1/PH2 cycle, as can be seen from FIG. 6.

The period counter SBUS decode/terminal count select circuit 132 selects among the four possible terminal counts recognized by circuit 136. Decoder 132 does this by decoding SBUS[0:4] 54. Possible terminal counts include a verification delay, VER, a program delay, PRG; an erase delay, ERS, and a source inhibit delay, VSI. Typical time periods are 10 μsec for PRG, 10 msec for ERS and 3 μsec for VER.

The operation of SBUS decoder 130 and 132 for each SBUS value can be determined with reference to FIG. 7. The signal name for each signal acronym can be seen in FIG. 8.

SBUS decoder 130 and select circuit 132 of FIG. 6 are both implemented as random logic in the preferred embodiment.

The counter 134 within the period counter is a 15 bit shift register with reset and will not be described in detail herein.

The counter 134 does not incorporate a counter enable, thus counter 134 continues to run in all states except for those in which it is reset by SBUS decoder 130. The counter 134 begins counting when RESET is deasserted. The counter's Q outputs 135 are input to the terminal count match circuit 136. Outputs Q13 and Q14 of Q outputs 135 are input to an exclusive NOR gate, the output of which is connected to the SHIFTIN input of counter 134.

The terminal count match circuit 136 determines whether the selected delay period has elapsed by analyzing Q outputs 135. The terminal count match circuit 136 indicates that the selected terminal count has been reached by bringing its output TCOUNT 137 to a logic high. The terminal count match circuit's output TCOUNT 137 is active for only one state because the counter 134 continues to increment its count.

Latch 138 is used in conjunction with OR gate 140 to store the terminal count 143 signal TCOUNT 137. The latch 138 is reset by RESET 49 when the write state machine 48 is first powered up, setting Q output 139 to a logic 0. When TCOUNT 137 goes active high, Q output 139 transitions to high. The Q output 139 keeps the latch's input 141 high after TCOUNT 137 goes low, thus keeping PCTRTC 56 high until the latch 138 is reset by RESET 49.

FIG. 9 illustrates in block diagram form the status register 60. The status register 60 includes a clock generator 150 and two output latches 152 and 154.

The status registers output signals ERASE SUSPEND 68 and BUSY 66 are synchronized to output enable bar signal OEB 22. The clock generator 150 accomplishes this synchronization by generating a set of clock pulses PH'1/PH'2 156 whenever OEB 22 toggles. Clock pulses PH'1/PH'2 156 control the clocking in of signals IDLE 64 and READY 62 into output latches 152 and 154. Thus, it will be understood that OEB 22 must be toggled in order to read valid data from output latches 152 and 154.

The IDLE signal 64 is input directly to the D input of output latch 152. Thus, it can be seen that the ERASE SUSPEND signal 68 is the IDLE signal 64 synchronized to OEB 22. After OEB 24 is toggled, ERASE SUSPEND 68 goes to logic high if the WSM 48 has entered idle state 112 or idle state 118.

The READY signal 62 is input directly to the D input of output latch 154. Thus, it can be seen that the WSM BUSY signal 66 is the READY signal 62 synchronized to OEB 22.

The BUSY signal 66 is a logic 0 when the WSM is programming or erasing. During erasure, BUSY 66 at a logic high indicates that the microprocessor 999 may now read nonselected blocks of the array.

The operation of the status register 60 can be understood with reference to the timing diagram of FIG. 10.

Operation of the write state machine 48 begins with the ERASE signal 70 going to an active high. The rising edge of ERASE 70 forces the RESET signal 49 to an active logic low, thereby releasing critical nodes within the write state machine 48 from known states. The rising edge of ERASE 70 also forces the READY signal 64 to an active logic low, signaling that the WSM 48 is now busy.

Sometime after the RESET signal 49 goes to a logic high, the write state machine outputs, SBUS[0:4] 54, become active.

When the output enable bar input OEB 22 is toggled by the microprocessor 999 in order to read the status register 60, the BUSY signal 66 signal follows the READY signal 62 and goes to a logic low. The status register 60 thereby indicates to the microprocessor 999 that the write state machine 48 is busy erasing the selected block with the memory array 12.

Sometime during an erase operation the microprocessor 999 may request that the erase operation be suspended in order to read nonselected blocks within memory 12. The microprocessor's request will cause the SUSPEND signal 72 to go to an active logic high.

Sometime after the SUSPEND signal 72 becomes active, the write state machine 48 enters an idle state 112 or 118. SBUS[0:4] 54 will be decoded by synchronizer 42 to force IDLE signal 64 to a logic high, thereby indicating to the CSM 40 and the status register 60 that the WSM 48 has suspended erasure.

When the microprocessor 999 checks the status register 60 by toggling OEB 22, the ERASE SUSPEND signal 68 will follow the IDLE signal 64 to a logic high, as is highlighted in FIG. 10 by the arrows. The microprocessor 999 is thus informed that machine 48 has suspended its operation and that microprocessor 999 may read data from nonselected blocks of memory 12.

The receipt of an Erase Resume command from the microprocessor 999 causes the command state machine 40 to bring the SUSPEND signal 72 to a logic low, signaling the write state machine 48 to resume erasing the selected block.

As shown in FIG. 10, the READY signal 62 falls to a logic low with the fall of the SUSPEND signal 72, indicating to CSM 40 that WSM 48 is busy. The synchronizer 42 brings the IDLE signal 64 to a logic low after the WSM 48 indicates via its SBUS[0:4] 54 that erasure has resumed.

When OEB 22 is toggled by the microprocessor 999 the ERASE SUSPEND signal 68 and BUSY signal 66 each fall to a logic low, indicating to the microprocessor 999 that the write state machine 48 is busy and no longer suspended.

An important feature of the IDLE signal 64 is that it surrounds the READY signal 62; i.e., the IDLE signal 62 rises to a logic high before the READY signal 62 and the IDLE signal 64 falls to a logic low after the READY signal 62. This feature of the IDLE signal 64 prevents the microprocessor 999 from being able to read false data from the status register 60. In other words, the microprocessor 999 will not be informed incorrectly that the write state machine 48 is ready to begin a new program or erase operation when in fact the write state machine 48 is in the process of resuming a suspended and incomplete erase operation.

Circuitry and a method for suspending the automated erasure of a non-volatile semiconductor memory has been described in detail. Suspension of erasure is initiated by an active suspend signal; however, erasure does not halt until a predetermined state in the erasure sequence is reached. Once that predetermined state is reached, write state machine 48 enters an idle mode and signals the rest of flash memory 10 that the WSM 48 is idle. The external processor 999 may then read data from nonselected blocks within flash memory 10. When the external processor 999 is finished reading data, it can initiate resumption of erasure by bringing the SUSPEND signal 72 to an inactive level.

In the foregoing specification, the invention has been described with specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of suspending execution of an automated erasure sequence of a nonvolatile electrically erasable semiconductor memory, the automated erasure sequence including a multiplicity of erasure steps, the erasure steps including a preconditioning step, a delay step, an erase pulse apply step, and an erase verification step, the method comprising the steps of:
   (a) receiving an erase suspend command and bringing a suspend signal active;
   (b) suspending the automated erasure sequence after a first erasure step in response to the active suspend signal;
   (c) receiving an erase resume command and bringing the suspend signal inactive; and
   (d) resuming execution of the automated erasure sequence with a second erasure step in response to the inactive suspend signal.

2. The method of claim 1, wherein the first erasure step is after the preconditioning step.

3. The method of claim 1, wherein the second erasure step is before the preconditioning step.

4. The method of claim 1, wherein the first erasure step is after the erase pulse apply step.

5. The method of claim 1, wherein the first erasure step is after the erase verification step.

6. The method of claim 1 wherein the second erasure step is before the erase pulse apply step.

7. A method for suspending an automated erasure sequence of a flash memory in response to a suspend signal, the suspend signal having an active level and an inactive level, the automated erasure sequence including a multiplicity of erasure sequence steps, the method comprising the steps of:
   (a) suspending the automated erasure sequence after a first erasure sequence step if the suspend signal is at the active level;
   (b) resuming the automated erasure sequence with a second erasure sequence step when the suspend signal is at the inactive level if the automated erasure sequence was suspended after the first erasure sequence step;
   (c) suspending the automated erasure sequence after a third erasure sequence step if the suspend signal is at the active level after a fourth erasure sequence step; and
   (d) resuming the automated erasure sequence with a fifth erasure sequence step when the suspend signal is at the inactive level if the automated erasure sequence was suspended after the third erasure sequence step.

8. The method of claim 7, wherein the third sequence erasure step is erasure verification.

9. The method of claim 7, wherein the flash memory includes an array for storing a multiplicity of bits and wherein the first erasure sequence step is a step after preconditioning of one bit stored in the array and before preconditioning of every bit stored in the array.

10. The method of claim 9, wherein the first erasure sequence step is waiting for a fixed period of time prior to executing another erasure sequence step.

11. A flash memory device fabricated on a single substrate, the flash memory device having a multiplicity of pins, the flash memory device comprising:
   a) an array of flash memory cells;
   b) a command state machine for recognizing commands written to the flash memory device via the multiplicity of pins and generating command control signals including a suspend signal, the command state machine bringing the suspend signal active in response to an erase suspend command for suspending execution of an erase command and bringing the suspend signal inactive in response to an erase resume command for resuming execution of a suspended erase command; and
   c) a write state machine for controlling an automated erasure sequence for erasing the array in response to the command control signals, the automated erasure sequence having a multiplicity of states, the write state machine including a next state controller for controlling a next state to be executed in the automated erasure sequence by generating a plurality of next state signals in response to the command control signals and a plurality of previous state signals, wherein:
      1) if the suspend signal becomes active during a state of the automated erasure sequence responsible for preconditioning the array, the next state controller completing execution of states of the automated erasure sequence responsible for preconditioning the array and then bringing the plurality of next state signals to voltage levels representing a first idle state of the automated erasure sequence while the suspend signal is active, the next state controller responding to the inactive suspend signal by bringing the plurality of next state signals to voltage levels representing a first state of the sequence of states responsible for preconditioning the array; and
      2) if the suspend signal becomes active during an erase verify state of the automated erasure sequence, the next state controller responding by bringing and holding the plurality of next state signals to voltage levels representing a second idle state of the automated erasure sequence while the suspend signal is active, when the suspend signal becomes inactive, the next state controller bringing the plurality of next state signals to voltage levels representing the erase verify state.

12. The flash memory device of claim 11 wherein the next state controller also responds to a period counter terminal count signal in generating the plurality of next state signals.

13. The flash memory device of claim 11 wherein the next state controller comprises a programmable logic array.

14. The flash memory device of claim 13 wherein the next state controller further comprises a latch having inputs coupled to the plurality of next state signals, the latch outputting the plurality of previous state signals.

15. A system comprising:
   a) a microprocessor generating a multiplicity of memory commands including a suspend erase command to suspend execution of an erase command and a resume erase command to resume execution of a suspended erase command; and
   b) a flash memory device coupled to the microprocessor via a multiplicity of pins, the flash memory device including:
      1) an array of flash memory cells;
      2) a command state machine for recognizing memory commands written by the microprocessor to the flash memory device via the multiplicity of pins and generating command control signals including a suspend signal, the command state machine bringing the suspend signal active in response to the erase suspend command and bringing the suspend signal inactive in response to the erase resume command; and
      3) a write state machine for controlling an automated erasure sequence for erasing the array in response to the command control signals, the automated erasure sequence having a multiplicity of states, the write state machine including a next state controller for controlling a next state to be executed in the automated erasure sequence by generating a plurality of next state signals in response to the command control signals and a plurality of previous state signals, wherein:
         A) if the suspend signal becomes active during a state in a sequence of states for preconditioning the array, the next state controller completing the sequence of states for preconditioning the array and then bringing and holding the plurality of next state signals to voltage levels representing a first idle state of the automated erasure sequence while the suspend signal is active, when the suspend signal goes inactive the next state controller responding to the inactive suspend signal by bringing the plurality of next state signals to voltage levels representing a first state of the preconditioning sequence of states; and
         B) if the suspend signal becomes active during an erase verify state of the automated erasure sequence the next state controller responding by bringing and holding the plurality of next state signals to voltage levels representing a second idle state of the automated erasure sequence while the suspend signal is active, when the suspend signal becomes inactive the next state controller bringing the plurality of next state signals to voltage levels representing the erase verify state.

16. The system of claim 15 wherein the next state controller also responds to a period counter terminal count signal in generating the plurality of next state signals.

17. The system of claim 15 wherein the next state controller comprises a programmable logic array.

18. The system of claim 17 wherein the next state controller further comprises a latch having inputs coupled to the plurality of next state signals, the latch outputting the plurality of previous state signals.

* * * * *

UNITED STATES PATENT AND TRADEMARK OFFICE
CERTIFICATE OF CORRECTION

PATENT NO. : 5,355,464  Page 1 of 3
DATED : October 11, 1994
INVENTOR(S) : Fandrich et al.

It is certified that error appears in the above-identified patent and that said Letters Patent is hereby corrected as shown below:

In the Abstract at [57] at line 1 insert --erase-- following "automated" and prior to "sequence"

In the Abstract at [57] at line 5 delete "of the erase sequence"

In the Abstract at [57] at lines 8-9 insert --the-- following "suspended" and prior to "automated"

In column 1 at line 47 delete "("MOS")" and insert --("CMOS")--

In column 2 at line 49 delete "and" and insert --a--

In column 5 at line 63 delete "with" and insert --via--

In column 6 at line 1 insert --a-- following "is" and prior to "logic"

In column 6 at line 9 delete "IDLE 64 signal" and insert --IDLE signal 64--

In column 6, line 58, after "next" insert —state—.

In column 6 at line 59 delete "state"

UNITED STATES PATENT AND TRADEMARK OFFICE
CERTIFICATE OF CORRECTION

PATENT NO. : 5,355,464
DATED : October 11, 1994
INVENTOR(S) : Fandrich et al.

It is certified that error appears in the above-identified patent and that said Letters Patent is hereby corrected as shown below:

In column 6 at line 64 delete "voltage" and insert --voltages--

In column 7 at lines 13-14 delete "BEGIN PRECOND" and insert --Begin Precondition --.

In column 7 at line 46 delete "states 108 from state 106." and insert --state 108 from states 106.--

In column 7 at line 53 delete "VSI DELAY" and insert --VSI Delay--

In column 8 at line 2 insert --60-- following "register" and prior to "that"

In column 8 at line 24 delete "the"

In column 9 at line 38 delete "143"

UNITED STATES PATENT AND TRADEMARK OFFICE
CERTIFICATE OF CORRECTION

PATENT NO. : 5,355,464
DATED : October 11, 1994
INVENTOR(S) : Fandrich et al.

It is certified that error appears in the above-indentified patent and that said Letters Patent is hereby corrected as shown below:

In column 10 at line 32 insert "idle state" following "or" and prior to "118"

In column 10 at line 61 delete "62 rises" and insert --64 rises--

Signed and Sealed this

Eleventh Day of March, 1997

Attest:

BRUCE LEHMAN

Attesting Officer

Commissioner of Patents and Trademarks